United States Patent
Ophir et al.

(10) Patent No.: US 8,700,376 B2
(45) Date of Patent: Apr. 15, 2014

(54) SYSTEM AND A METHOD FOR MAPPING A MAGNETIC FIELD

(75) Inventors: Yoav Ophir, Zichron Ya'acov (IL); Uzi Eichler, Haifa (IL); Ilan Efrat, Haifa (IL); Guy Mencel, Pardes Hanna-Karkur (IL); Mark Gandelsman, Haifa (IL); Alon Izmirli, Ginot Hadar (IL)

(73) Assignee: Elbit Systems Ltd., Haifa (IL)

( * ) Notice: Subject to any disclaimer, the term of this patent is extended or adjusted under 35 U.S.C. 154(b) by 294 days.

(21) Appl. No.: 13/129,781

(22) PCT Filed: Nov. 5, 2009

(86) PCT No.: PCT/IL2009/001043
§ 371 (c)(1),
(2), (4) Date: May 17, 2011

(87) PCT Pub. No.: WO2010/058390
PCT Pub. Date: May 27, 2010

(65) Prior Publication Data
US 2011/0238399 A1    Sep. 29, 2011

(30) Foreign Application Priority Data
Nov. 19, 2008    (IL) .......................... 195389

(51) Int. Cl.
*G06F 17/50*    (2006.01)
*G06G 7/62*    (2006.01)

(52) U.S. Cl.
CPC .................. *G06F 17/5022* (2013.01)
USPC ............................................ 703/13; 702/152

(58) Field of Classification Search
USPC ......................................... 703/13; 702/152
See application file for complete search history.

(56) References Cited

U.S. PATENT DOCUMENTS

| | | | |
|---|---|---|---|
| 5,646,524 A | 7/1997 | Gilboa | |
| 5,646,525 A | 7/1997 | Gilboa | |
| 5,760,335 A | 6/1998 | Gilboa | |
| 5,847,976 A | 12/1998 | Lescourret | |
| 7,277,834 B2 | 10/2007 | Bar Tal | |
| 7,542,869 B2 | 6/2009 | Gandelsman | |
| 7,603,251 B1* | 10/2009 | Wiegert et al. | 702/152 |
| 8,200,314 B2* | 6/2012 | Bladen et al. | 600/427 |
| 2007/0035563 A1 | 2/2007 | Biocca | |
| 2007/0299623 A1 | 12/2007 | Gandelsman | |
| 2009/0012532 A1* | 1/2009 | Quaid et al. | 606/130 |
| 2009/0281417 A1* | 11/2009 | Hartmann et al. | 600/424 |

FOREIGN PATENT DOCUMENTS

WO    WO2006/054295    *    5/2006

OTHER PUBLICATIONS

Livingston, "Magnetic Tracker Calibration for Improved Augmented Reality Registration", Aug. 30, 2001, 14 Pages.

* cited by examiner

*Primary Examiner* — Eunhee Kim

(57) ABSTRACT

A system for mapping a magnetic field in a volume of interest, the system includes a magnetic field transmitter, generating a magnetic field in the volume of interest, at least one freestanding magnetic field detector, operative to freely move within the volume of interest, the at least one freestanding magnetic field detector acquiring measurements of the flux of the magnetic field at a plurality of poses, and a processor, coupled with the magnetic field detector, the processor re estimating parameters characterizing the magnetic field model according to deviations between the measurements of the flux of the magnetic field and according to predictions of the flux, the predictions being determined according to a stored magnetic field model, thereby, the processor estimating a new magnetic field model.

47 Claims, 6 Drawing Sheets

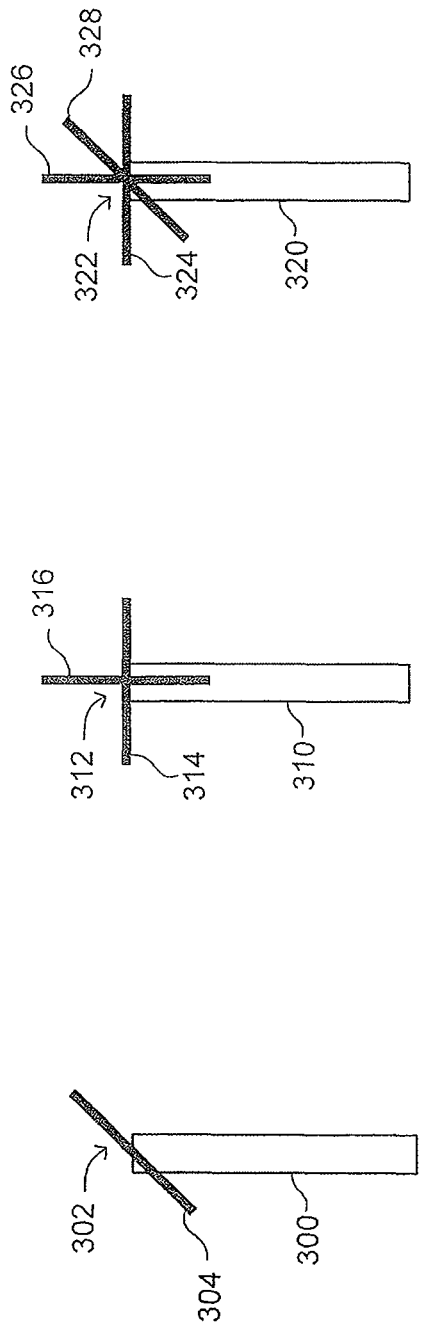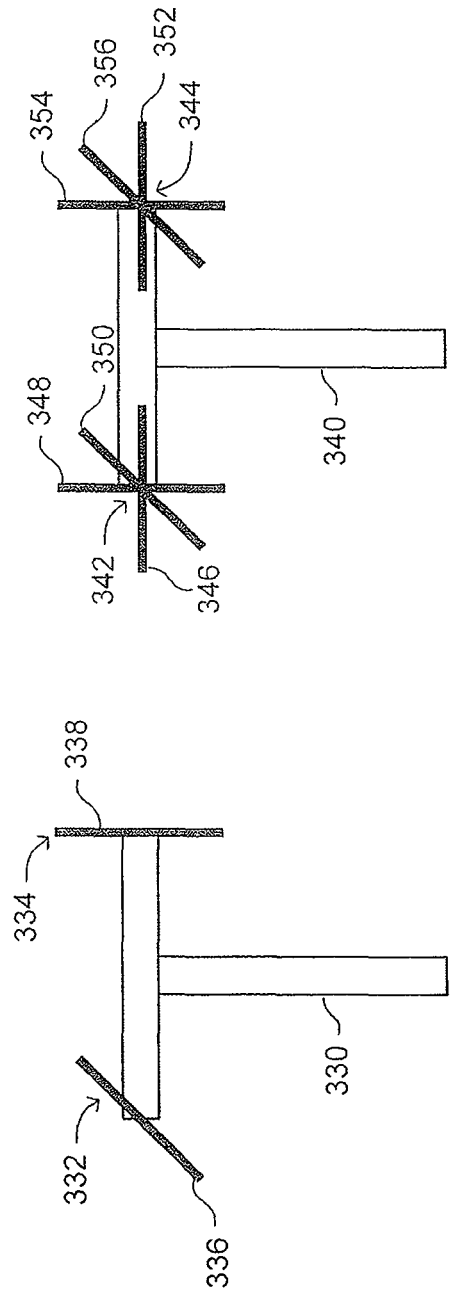
FIG. 5A FIG. 5B FIG. 5C FIG. 5D FIG. 5E

SYSTEM AND A METHOD FOR MAPPING A MAGNETIC FIELD

CROSS-REFERENCE TO RELATED APPLICATIONS

This application claims the benefit of PCT Application Serial No. PCT/IL2009/001043, filed 5 Nov. 2009, titled "A System and a Method for Mapping a Magnetic Field", which PCT application claimed the benefit of Israeli application serial number 195389, filed 19 Nov. 2008. Both applications are incorporated by reference as if reproduced in full below.

FIELD OF THE DISCLOSED TECHNIQUE

The disclosed technique relates to magnetic field, in general, and to systems and methods for mapping magnetic fields, in particular.

BACKGROUND OF THE DISCLOSED TECHNIQUE

Applications of tracking an object, within a volume of interest, are known in the art. For example, tracking a helmet, worn by a pilot in a cockpit is used to determined the location and orientation that the pilot is looking at (i.e., by further determining the gaze direction of the eye of the pilot). Tracking a catheter, within a body of a patient, may be used to display a representation of the catheter on an image of the body (e.g., an X-Ray image, CT image, MRI image, PET image and the like). Tracking various body parts of a person may be used to emulate the movement of that person in a virtual reality environment.

Systems for tracking an object, within a volume of interest using magnetic fields, are known in the art. These systems are referred to herein as "magnetic tracking systems". Magnetic tracking systems track the object by repeatedly determining the location and orientation of the object, in the volume of interest, relative to a coordinate system associated with the magnetic tracking system. The term "pose" refers hereinafter to either location orientation or both. The term "location" relates to the coordinates of an object (i.e., according to a determined coordinate system such as X, Y, Z) and the term "orientation" relates to the direction of the object in the determined coordinate system (e.g., Eulers angles). The term "magnetic coordinate system" refers hereinafter to a coordinate system associated with the magnetic tracking system. In general, magnetic tracking systems employ a magnetic field transmitter and a magnetic field detector. The magnetic field transmitter may employ several magnetic field generators (e.g., coils with electric current flowing there through). The magnetic field detector may employ several magnetic field sensors (e.g., coils with electric current induced therein, hall-effect sensors). In general, for the purpose of magnetic tracking, the number of generators times the number of sensors should at least equal the number of required location and orientation parameters (e.g., the number of required location and orientation parameters may be six, three for location and three for orientation). According one configuration of magnetic tracking systems, the magnetic field transmitter is fixed at a known pose in the volume of interest and the magnetic field detector is mounted on the tracked object. According to another configuration of magnetic tracking systems, the magnetic field transmitter is mounted on the tracked object and the magnetic field detector is fixed at a known pose in the volume of interest.

To determine the position of the tracked object, within a volume of interest, using magnetic fields, the amplitude and direction of the magnetic field at each location in the volume of interest should be known (i.e., either measured or computed). The amplitude and direction of the magnetic field is referred to hereinafter as the "magnetic field vector". The ensemble of magnetic field vectors at corresponding locations in the volume of interest is referred to hereinafter as the "magnetic field map". The magnetic tracking system determines the pose of a tracked object by measuring the magnetic flux at that pose. The magnetic tracking system determines the magnetic field vector according to the measured magnetic flux, and determines the pose corresponding to that magnetic field vector according to the magnetic field map.

A magnetic field map may have one of several forms. Accordingly, the magnetic field map may have the form of a physical model relating each location in the volume of interest with an amplitude and direction of the magnetic field. The physical model includes physical parameters. For example, when the magnetic field is generated by a coil, the magnetic field model may be that of a dipole with physical parameters such as coil radius and the number of turns of the coil. Alternatively, the magnetic field map may have the form of a mathematical model, without any knowledge of the physical parameters of the magnetic field (e.g., polynomial, spline). According to yet another alternative, the magnetic field map may be in the form of a Look Up Table (LUT) associating between a selected number of known locations in the volume of interest with corresponding values of the magnetic field vectors at these selected locations. The value of the magnetic field vectors, between entries in the LUT, is determined according to an interpolation scheme (e.g., an interpolation function such as a straight line, a sinc function etc).

The magnetic field map may be determined at the manufacturing stage of the magnetic field transmitter. However, such a map does not allow for all the interferences introduced to the magnetic field in a specific volume of interest (e.g., interferences caused by ferromagnetic objects or other electromagnetic transmitters within the volume of interest). The magnetic field map may be determined, prior to tracking, individually for each volume of interest. This map includes the interferences (i.e., when those exist) introduced to the magnetic field in the volume of interest (e.g., due to metallic objects present in the volume of interest). Accordingly, the magnetic field transmitter is activated and the magnetic field detector is moved through a plurality of known poses in the volume of interest. The magnetic field detector measures the magnetic field vector at each known location. A processor processes these measurements and produces the magnetic field map. When the magnetic field map is a physical model or a mathematical model, the processor estimates the parameters (i.e., the physical parameters or the mathematical parameters) to determined the model that best fits the measurements. When the magnetic field map is a LUT, the processor constructs the LUT according to the measurements and the known locations. It is noted that the term "mapping" refers to herein after to determining the magnetic field map. The terms "magnetic field model" and "model" will be used herein interchangeably.

Additionally, when the magnetic tracking system is required to determine the pose of the tracked object in a coordinates system associated with the volume of interest, the magnetic tracking system registers the magnetic field map with the coordinate system associated with the volume of interest. The coordinate system associated with the volume of interest is referred to herein as the "reference coordinate system". The term "registering" refers to determining a correspondence between the poses relative to the magnetic coordinate system and the poses relative to the reference coordinate system. This reference coordinate system is, for example, the coordinate system of the airplane, the coordinate system of a virtual environment or the coordinate system of a medical image. Thus, the location and orientation of the tracked object is known relative to the reference coordinate system. The magnetic tracking system registers the magnetic field map with a reference coordinate system for example, by placing the magnetic field detector at a known pose relative to the reference coordinate system and determines the pose of the magnetic field detector relative to the magnetic coordinate system. Alternatively, when the pose of the magnetic field transmitter, relative to the reference coordinate system, is known, each pose relative to the magnetic coordinate system is associated with a respective pose relative to the reference coordinate system.

The publication to Livingston et al., entitled "Magnetic Tracker Calibration for Improved Augmented Reality Registration", directs to a system and a method for mapping a magnetic field using LUT and for registering the magnetic field map with a reference coordinate system. According to Livingston et al., a magnetic tracking system tracks the pose of a receiver attached to the object being tracked. However, metal and electromagnetic devices (e.g., computers, Cathode Ray Tubes, metal objects and electrical wirings) distort the field created by the transmitter. Therefore, the magnetic field model, used by the magnetic tracking system, may be inaccurate. Thus, the system to Livingston et al maps the magnetic field and determines correction factors for each location in the volume of interest. Accordingly, the receiver is attached to six degrees of freedom mechanical arm tracker, which determines a vector of locations and orientations of the tip of the arm relative to the base of the arm. The coordinates system associated with the mechanical tracking systems serves as the reference coordinate system. Thus, each pose determined by the magnetic tracking system, has a pose determined by the mechanical tracking system associated therewith. The differences between these associated poses are used to determine the corrections needed for the poses determined by the magnetic tracking system.

U.S. Pat. No. 5,847,976 to Lescourret, entitled "Method to Determine the Position and Orientation of a Mobile System, Especially the Line Of Sight in a Helmet Visor", directs to analytic modeling of electromagnetic fields. These fields include a first electromagnetic field created by a transmitter, a second field created by eddy currents induced in metal object within the volume of interest by a first field and a third field created by currents induced in the tracked object (e.g., a helmet of a pilot) by the first and second fields. Each one of the three fields is characterized independently of the other fields by the coefficients of a model associated with each field.

The first field is determined by measuring the field created by the transmitter in free space. The field is measured at points of measurements by translating a mechanical system bearing the sensor through these points. The parameters of a model of this field are estimated.

The second field is determined by measuring the field within the volume of interest including the metal objects. The field is measured at points of measurements by translating a mechanical system bearing the sensor through these points. The parameters of a combined model including both the first and the second field are estimated. The model of the first field is subtracted from this combined model.

The third field is determined by first plunging disturbance sources into the magnetic field produced by the transmitter. The model of the disturbance due to each disturbance source, at the sensor, is modeled as an explicit function of the existing mean field at the point of origin of a coordinate system defining this source. Thus, the model of each source depends explicitly on the field into which each source is plunged into. In a second stage, the sensor is plunged into the magnetic field and the disturbance caused by each source is determined by its model and of the mean magnetic field. In a third stage, disturbances due to the sources are summed. Finally, in a fourth stage, this sum is deducted from the measurement made by the sensor. In this way, all the parameters of the source model representing the phenomenon of disturbance produced by this source are independent of the field into which the sensor and all the sources are plunged.

SUMMARY OF THE PRESENT DISCLOSED TECHNIQUE

It is an object of the disclosed technique to provide a novel system and method for mapping a magnetic field by freely moving a magnetic field detector within a volume of interest.

In accordance with the disclosed technique, there is thus provided system for mapping a magnetic field in a volume of interest. The system includes a magnetic field transmitter, at least one freestanding magnetic field detector and a processor. The magnetic field transmitter generates a magnetic field in the volume of interest. The freestanding magnetic field detector is operative to freely move within the volume of interest. The freestanding magnetic field detector acquires measurements of the flux of the magnetic field at a plurality of poses. The processor is coupled with the magnetic field detector. The processor re-estimates parameters characterizing the magnetic field model according to deviations between the measurements of the magnetic field and according to predictions of the flux. The predictions are determined according to a stored magnetic field model. Thereby the processor estimates a new magnetic field model.

In accordance with another aspect of the disclosed technique, there is thus provided a method for mapping a magnetic field in a volume of interest. The method includes the procedures of freely moving at least one magnetic field detector within a volume of interest, acquiring measurements of magnetic field flux at a plurality of poses of the freestanding magnetic field detectors in the volume of interest. The method further includes the procedure of re-estimating parameters characterizing a magnetic field model, according deviations between the measurements of the magnetic field flux and predictions of the magnetic field flux at the poses of the magnetic field detector.

In accordance with a further aspect of the disclosed technique, there is thus provided a system for mapping a magnetic field in a volume of interest. The system includes a magnetic field transmitter, two freestanding magnetic field detectors and a processor. The two freestanding magnetic field detectors are firmly coupled with a freestanding mapping handle. The processor is coupled with the magnetic field detector. The magnetic field transmitter generates a magnetic field in the volume of interest. The two freestanding magnetic field detectors are operative to freely move within the volume of interest. The two freestanding magnetic field detectors acquire measurements of the flux of the magnetic field at a plurality of poses. The processor re-estimates parameters characterizing the magnetic field model according to deviations between the measurements of the flux of the magnetic field, and according to predictions of the flux. The predictions are determined according to a stored magnetic field model. Thereby the processor estimates a new magnetic field model.

BRIEF DESCRIPTION OF THE DRAWINGS

The disclosed technique will be understood and appreciated more fully from the following detailed description taken in conjunction with the drawings in which:

FIG. 5A is a schematic illustration of a mapping handle and a magnetic field detector constructed and operative in accordance with a further embodiment of the disclosed technique;

FIG. 5B is a schematic illustration of a mapping handle and a magnetic field detector constructed and operative in accordance with another embodiment of the disclosed technique;

FIG. 5C is a schematic illustration of a mapping handle and a magnetic field detector constructed and operative in accordance with a further embodiment of the disclosed technique;

FIG. 5D is a schematic illustration of a mapping handle and a magnetic field detector constructed and operative in accordance with another embodiment of the disclosed technique;

FIG. 5E is a schematic illustration of a mapping handle and a magnetic field detector constructed and operative in accordance with a further embodiment of the disclosed technique:

DETAILED DESCRIPTION OF THE EMBODIMENTS

The disclosed technique overcomes the disadvantages of the prior art by providing a method and a system for mapping a magnetic field and thus determining the parameters characterizing a magnetic field model by freely moving a magnetic field detector within the volume of interest. According to the disclosed technique a magnetic field detector is mounted on a freestanding mapping handle. Thus, the magnetic field detector is also freestanding. A magnetic field transmitter is activated and produces a magnetic field in the volume of interest. An operator moves the mapping handle in the volume of interest. The detector measures the magnetic field during the movement of the mapping handle. A processor estimates the parameters characterizing the magnetic field model according to the measurements of the magnetic field.

According to one embodiment of the disclosed technique, the operator freely moves the mapping handle, and thus the magnetic field detector, randomly through the volume of interest. According to another embodiment of the disclosed technique, the operator is guided to freely move the mapping handle to a plurality of mapping regions within the volume (e.g., audio instructions or visual instructions such as a display showing the volume of interest with representations of the regions marked on the display). The term "freely moves" refers to herein to unconstraint movement of the mapping handle (i.e., the trajectory of mapping handle, from one pose in the volume of interest to another pose in the volume of interest, has no constraints thereupon). Alternatively, the magnetic field detector may be mounted on a mechanical support such as a mechanical arm capable of freely moving the magnetic field detector through a plurality of poses (i.e., locations or orientation or both) within the volume of interest.

The poses of the detector, relative to the reference coordinate system, at the mapping regions, may be unknown. According to a further embodiment, the system according to the disclosed technique determines the pose of the detector relative to the coordinate system by optically tracking the pose (i.e., location or orientation or both) of the detector. According to another alternative, the magnetic field detector is placed in known poses relative to the reference coordinate system. The processor estimates the poses of the detector relative to the magnetic coordinate system. Alternatively, the poses of the detector, relative to the reference coordinate system, at the mapping regions, may be partially known. For example, when only the locations of the detector are known, then, the system according to the disclosed technique determines only the orientations of the detector in the reference coordinate system. When only the orientations of the detector are known, then, the system according to the disclosed technique determines only the locations of the detector in the reference coordinate system.

Figure 1:
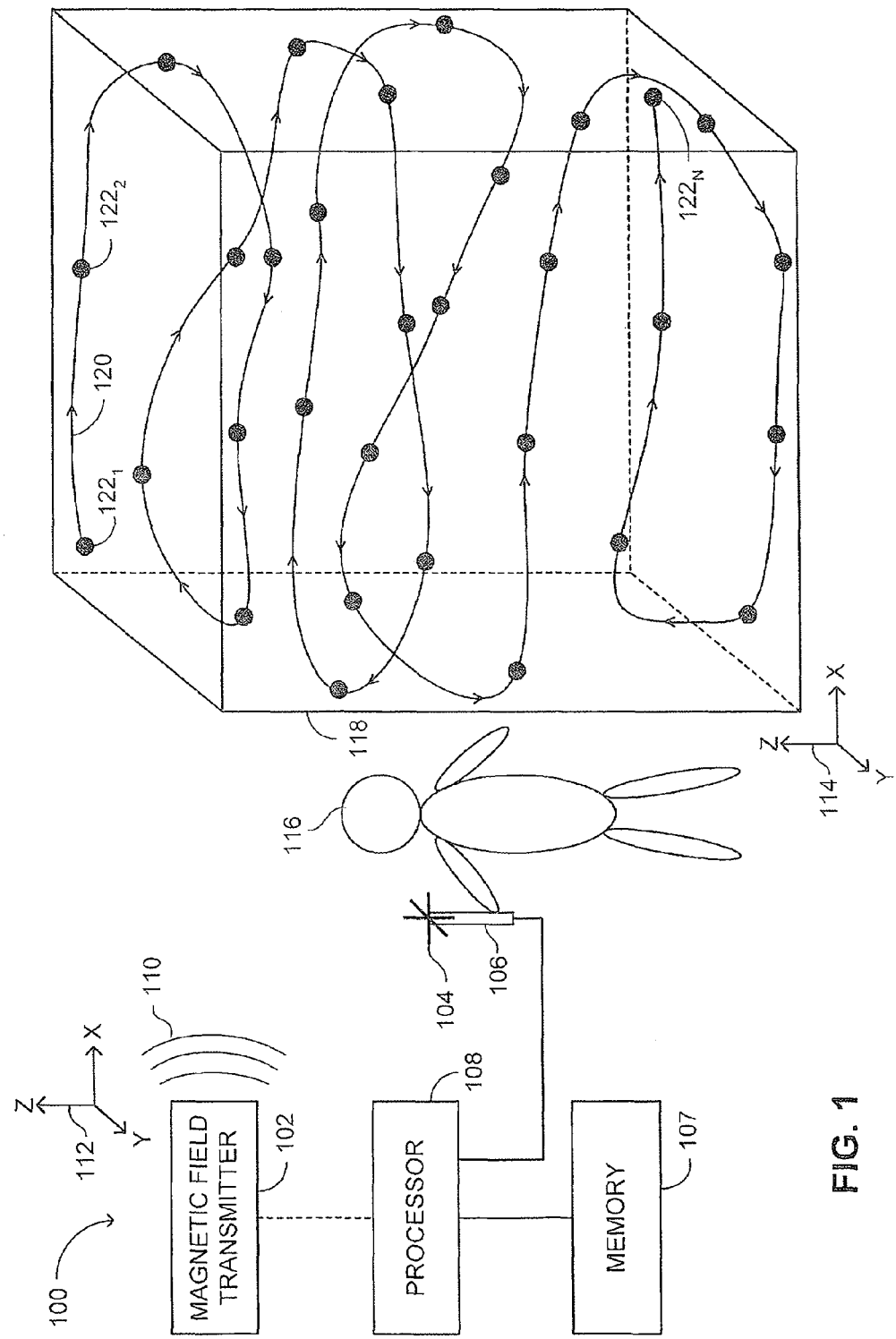
FIG. 1 is a schematic illustration of a system for mapping a magnetic field in a volume of interest, constructed and operative in accordance with an embodiment of the disclosed technique.

Reference is now made to FIG. 1, which is a schematic illustration of a system, generally referenced 100, for mapping a magnetic field in a volume of interest, constructed and operative in accordance with an embodiment of the disclosed technique. System 100 includes a magnetic field transmitter 102, a magnetic field detector 104, a freestanding mapping handle 106, a memory 107 and a processor 108. Magnetic field transmitter 102 includes one or more (e.g., three) magnetic field generators (e.g., coils with electric current flowing there through—not shown). Each magnetic field generator generates a magnetic field which is uniquely identifiable (e.g., each magnetic field has a unique frequency and the fields are transmitted at substantially the same time or, each magnetic field is generated at a different time). Magnetic field detector 104 includes one ore more (e.g., three) magnetic field sensors (e.g., coils with electric current induced therein, hall-effect sensors). In general, for the purpose of mapping a magnetic field, the number of magnetic field sensors in the magnetic field detector times the number of magnetic field generators in the magnetic field transmitter must be larger than the number of degrees of freedom required to track the object. For example, for six degrees of freedom, three for location and three for orientation, the number of magnetic field sensors in magnetic field detector 104, times the number of magnetic field generators in magnetic field transmitter 102, must be larger than six (e.g., nine). Thus, system 100 acquires additional information relating to the deviations between the magnetic field flux predicted by the magnetic field model, and the magnetic field flux measured by magnetic field detector 104. This information is related to the parameters of the magnetic field model.

Processor 108 is coupled with memory 107 and with magnetic field detector 104. Processor 108 is, optionally, further coupled with magnetic field transmitter 102 (i.e., magnetic filed transmitter 102 may operate independently of processor 108). When processor 108 is not coupled with magnetic field transmitter 102, then processor 108 requires information regarding the operation of magnetic field transmitter 102 (e.g., transmission frequency, transmission power, duty cycle and the like). Magnetic field detector 104 is firmly coupled with freestanding mapping handle 106. Thus, magnetic field detector 104 is also freestanding. Magnetic field transmitter 102, and thus magnetic field 110 are associated with a magnetic coordinate system 112. Memory 107 stores a magnetic field model. Volume of interest 118 is associated with a reference coordinate system 114.

Magnetic field transmitter 102 generates a magnetic field 110 toward a volume of interest 118. An operator 116 holds freestanding mapping handle 106 in her hand. Operator 116 freely moves freestanding mapping handle 106 (i.e., the trajectory of the mapping handle 106, from one pose in the volume of interest to another pose in the volume of interest, has no constraints thereupon) through volume of interest 118, to acquire a sufficient amount of samples, for a required degree of accuracy of the magnetic field model. Thus, magnetic field detector 104 freely moves within volume of interest 118 at a random trajectory 120. When operator 116 freely moves freestanding mapping handle 106 through volume of interest 118, magnetic field detector 104 measures the magnetic flux at a plurality of poses $122_1$-$122_N$ (i.e., either a plurality of locations or a plurality of orientation or both) and stores these measurements in memory 107. Processor 108 determines the magnetic field vectors corresponding to each of poses $122_1$-$122_N$, according to the measurements of the magnetic field flux. Processor 108, estimates poses $122_1$-$122_N$ of magnetic field detector 104 relative to magnetic coordinate system 112, according to the determined corresponding magnetic field vectors.

When no previous model of the magnetic field exists, processor 108 estimates poses $122_1$-$122_N$ relative to magnetic coordinate system 112, according to a generic model of magnetic field 110 (e.g., a model of one or more magnetic dipoles with guessed or heuristically determined parameters) stored in memory 107. Processor 108 uses these pose estimations to estimate the parameters characterizing the magnetic field model of magnetic field 110. Processor 108 estimates the parameters characterizing the magnetic field model according to deviations between the measurements of the magnetic field flux and predictions of the magnetic field flux, at the estimated poses, determined according to the stored magnetic field model (i.e., either the generic model or a previously estimated magnetic field that is stored in memory 107). Thus, processor 108 estimates a new magnetic field model and stores this new model in memory 107 instead of the previous model. Processor 108 may use the new estimated magnetic field model to re-estimate the poses $122_1$-$122_N$ (i.e., relative to magnetic coordinate system 112) of magnetic field detector 104 and use these re-estimated poses to re-estimate the parameters characterizing the magnetic field model. Processor 108 may repeat this iterative process for a predetermined number of times or until a desired degree of accuracy is achieved. Processor 108 stores the estimated parameters in memory 107. Estimating the parameters of a magnetic field model is further explained herein below, in conjunction with FIG. 7. Furthermore, processor 108 registers magnetic coordinate system 112 with a reference coordinate system 114. Thus, each pose (i.e., location or orientation or both) in magnetic coordinate system 112 has a corresponding pose in reference coordinate system 114. Registering a magnetic coordinate system with a reference coordinate system is further explained in conjunction with FIG. 4.

Alternatively, processor 108 estimates the magnetic field model according to deviations between the values of parameters measured in each sensor or magnetic field detector (e.g., the amplitude, frequency and phase of the magnetic field) and the values of the same parameters predicted by magnetic field model stored in memory 107. It is noted that processor 108 does not necessarily estimates the pose of magnetic field detector 104 according to the model, only the relevant parameters.

According to another embodiment, the system according to the disclosed technique guides the operator through a plurality of mapping regions within the volume of interest. The system may guide the operator, for example, by audio signals (e.g., sounds corresponding to directions, synthesized words). The system may guide the operator visually (e.g., a display displaying representations of the mapping regions and the freestanding mapping handle thereon or by displaying arrows directing an operator to move the mapping handle in a selected direction).

Figure 2:
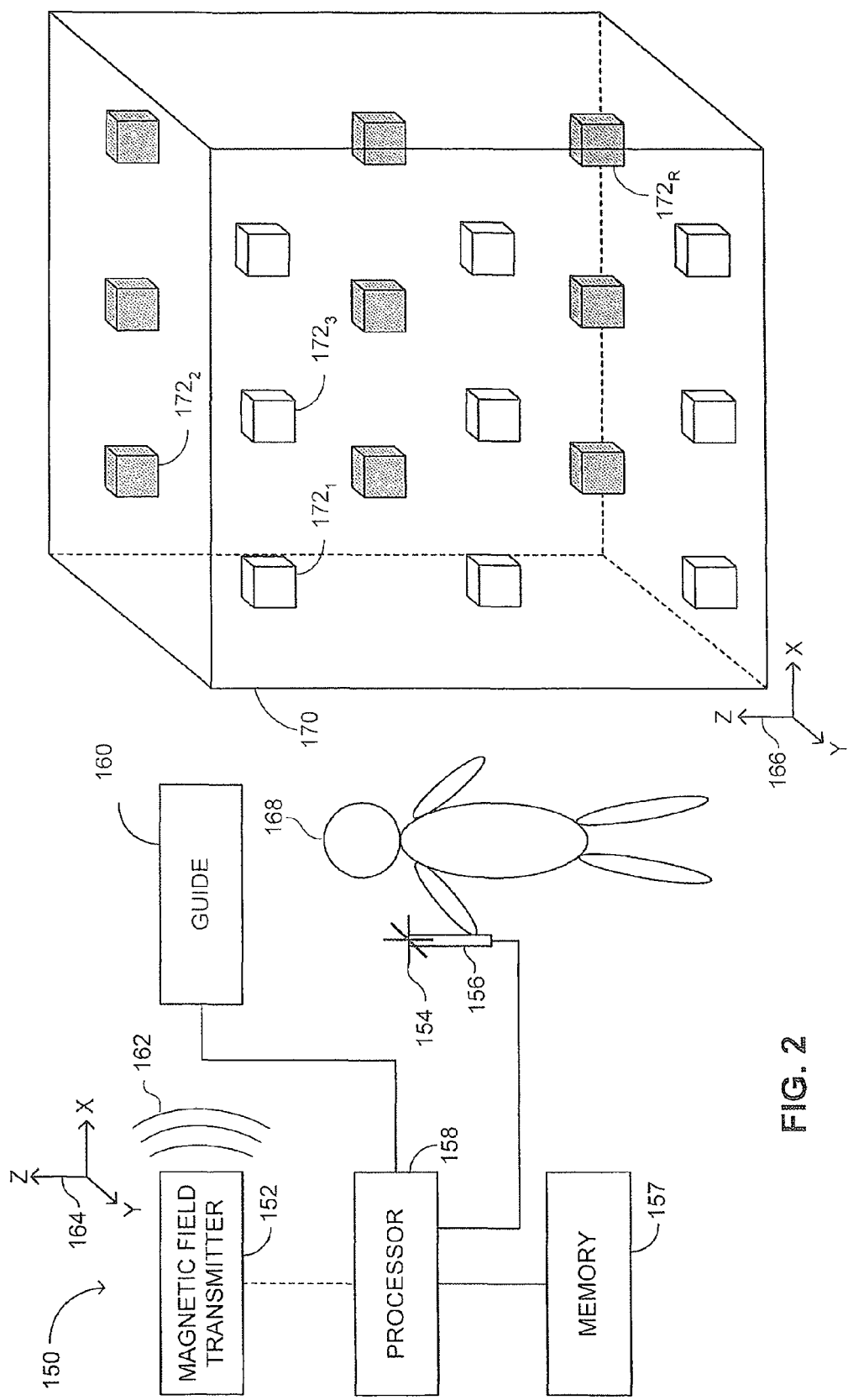
FIG. 2 is a schematic illustration of a system for mapping a magnetic field in a volume of interest, constructed and operative in accordance with another embodiment of the disclosed technique.

Reference is now made to FIG. 2, which is a schematic illustration of a system, generally referenced 150, for mapping a magnetic field in a volume of interest, constructed and operative in accordance with another embodiment of the disclosed technique. System 150 includes a magnetic field transmitter 152, a magnetic field detector 154, a freestanding mapping handle 156, a processor 158, a memory 157 and a guide 160. Magnetic field transmitter 152 includes one or more (e.g., three) magnetic field generators (e.g., coils with electric current flowing there through—not shown). Each magnetic field generator generates a magnetic field which is uniquely identifiable (e.g., each magnetic field has a unique frequency or each magnetic field is generated at a different time). Magnetic field detector 154 includes one or more (e.g., three) magnetic field sensors (e.g., coils with electric current induced therein, hall-effect sensors). For the purpose of mapping a magnetic field, the number of magnetic field sensors in magnetic field detector 154 times the number of magnetic field generators in magnetic field transmitter 152 must be larger than the number of degrees of freedom required for tracking the object. Guide 160 may be a loudspeaker sounding audio signals or a display displaying representations of the volume of interest 170 and freestanding mapping handle 156 (e.g., a two dimensional or a three dimensional representation).

Processor 158 is coupled with magnetic field detector 154, with memory 157 and with guide 160. Processor 158 is, optionally, further coupled with magnetic field transmitter 152 (i.e., magnetic filed transmitter 152 may operate independently of processor 158). When processor 158 is not coupled with magnetic field transmitter 152, then processor 158 requires information regarding the operation of magnetic field transmitter 152 (e.g., transmission frequency, transmission power, duty cycle and the like). Magnetic field detector 154 is firmly coupled with freestanding mapping handle 156. Thus, magnetic field detector 154 is also freestanding. Magnetic field transmitter 152, and thus magnetic field 162 are associated with a magnetic coordinate system 164. Memory 157 stores a magnetic field model. Volume of interest 170 is associated with a volume coordinate system 166.

Magnetic field transmitter 152 generates a magnetic field 162 toward volume of interest 170. An operator 168 holds freestanding mapping handle 156 in his hand. Guide 160 guides the operator 168 to freely move mapping handle 156 (i.e., the trajectory of the mapping handle 156, from one pose in the volume of interest to another pose in the volume of interest, has no constraints thereupon). Thus, magnetic field detector 154 also freely moves within volume of interest 170 through mapping regions $172_1$-$172_R$. Guide 160 guides the operator 168 to freely move freestanding mapping handle 156 at least until magnetic field detector 154 has moved through all the mapping regions $172_1$-$172_R$. Guide 160 guides operator 168, for example, by sounding audio signals corresponding to directions, or sounding synthesized words. Alternatively, guide 160 guides operator 168 visually. For example, guide 160 is a display (e.g., a two dimensional display or a three dimensional display) displaying representations of the mapping regions $172_1$-$172_R$, or a pose related thereto, and freestanding mapping handle 156 thereon. The representations of mapping regions $172_1$-$172_R$ may be deleted from the display, or otherwise marked, when magnetic field detector 154 passes there through. Alternatively, guide 160 displays arrows directing operator 168 to move freestanding mapping handle 156 toward a selected direction.

Magnetic field detector 154 measures the magnetic field vectors at a plurality of regions $172_1$-$172_R$ and stores these measurements in memory 157. As described above, in conjunction with FIG. 1, magnetic field detector 154 measures the magnetic flux at a plurality of pose of magnetic field detector 154 in regions $172_1$-$172_R$. Processor 158 determines the magnetic field vectors corresponding to each pose of magnetic field detector 154, according to the measurements of the magnetic field flux. Processor 158 estimates the poses of magnetic field detector 154, relative to magnetic coordinate system 164, according to the determined corresponding magnetic field vectors.

When no previous model of the magnetic field exists, processor 158 estimates the poses of magnetic field detector 154 relative to magnetic coordinate system 164, according to a generic model of magnetic field 162 stored in memory 157. Processor 158 uses these pose estimations to estimate the parameters characterizing the magnetic field model of magnetic field 162. Processor 158 estimates the parameters characterizing the magnetic field model according to deviations between the measurements of the magnetic field flux and predictions of the magnetic field flux, at the estimated poses, determined according to the stored magnetic field model (i.e., the magnetic field that is stored in memory 157). Thus, processor 158 estimates a new magnetic field model and stores this new model in memory 157 instead of the previous model. Processor 158 may use the new estimated magnetic field model to re-estimate the poses (i.e., relative to magnetic coordinate system 164) of magnetic field detector 154 and uses these re-estimated poses to re-estimate the parameters characterizing the magnetic field model. Processor 158 may repeat this iterative process for a predetermined number of times or until a desired degree of accuracy is achieved. Processor 158 stores the estimated parameters in memory 157.

The freestanding mapping handle may be coupled with a mechanical arm instead of being hand held by an operator. The mechanical arm is capable of freely moving through a plurality of poses within the volume of interest (i.e., the trajectory of the mechanical arm from one pose in the volume of interest to another pose in the volume of interest has no constraints thereupon). Accordingly, the mechanical arm either moves randomly through a plurality of poses within the volume of interest or guide through a plurality of regions of interest within the volume of interest.

Figure 3:
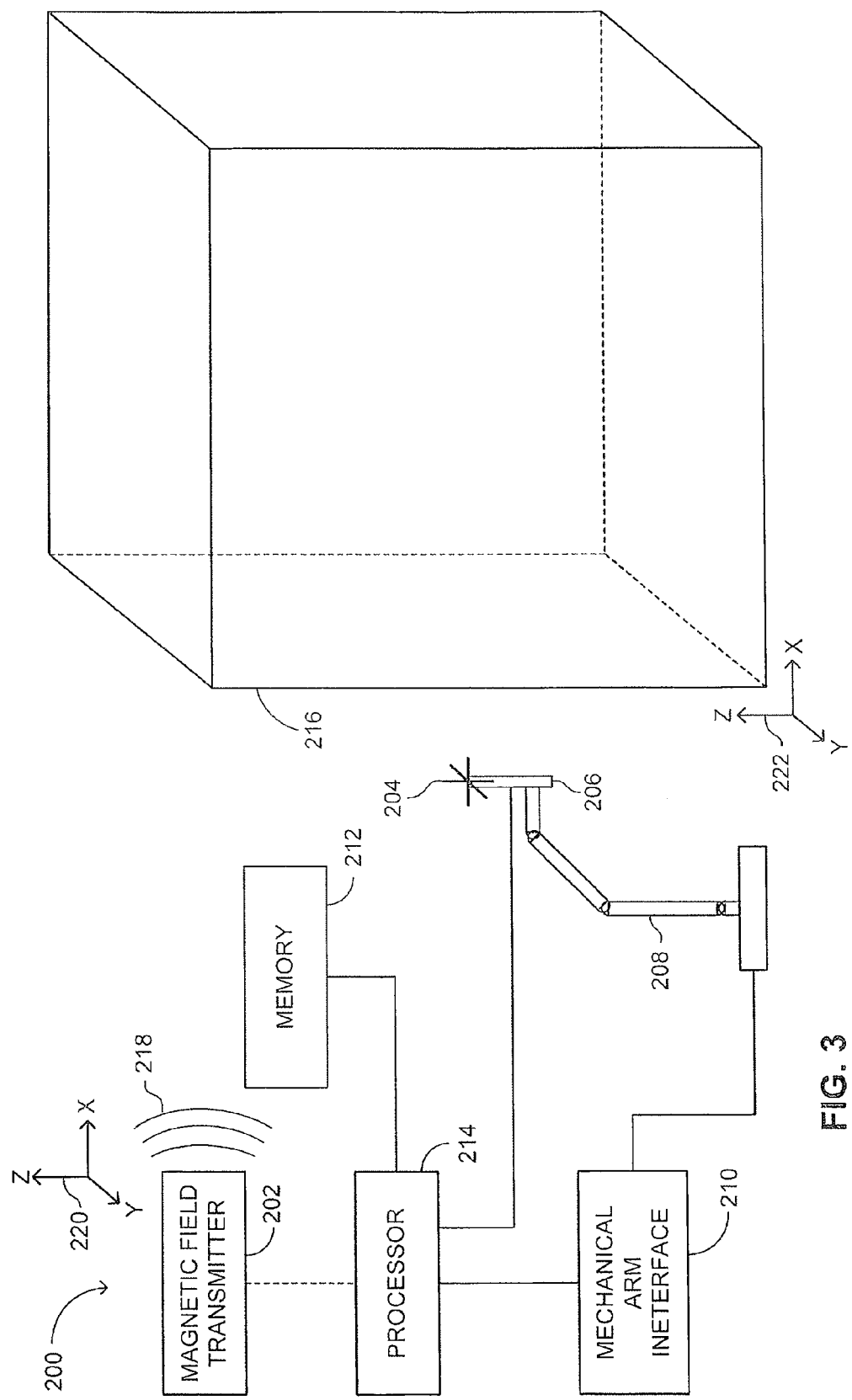
FIG. 3 is a schematic illustration of a system, constructed and operative in accordance with a further embodiment of the disclosed technique.

Reference is now made to FIG. 3, which is a schematic illustration of a system, generally reference 200, constructed and operative in accordance with a further embodiment of the disclosed technique. System 200 includes a magnetic field transmitter 202, a magnetic field detector 204, a mapping handle 206, a mechanical arm 208, a mechanical arm interface 210, a memory 212, and a processor 214. Magnetic field transmitter 202 includes one ore more (e.g., three) magnetic field generators (e.g., three coils with electric current flowing there through—not shown). Each magnetic field generator generates a magnetic field which is uniquely identifiable (e.g., each magnetic field has a unique frequency or each magnetic field is generated at a different time). Magnetic field detector 204 includes one or more (e.g., three) magnetic field sensors (e.g., coils with electric current induced therein, hall-effect sensors). For the purpose of mapping a magnetic field, the number of magnetic field sensors in magnetic field detector 204 times the number of magnetic field generators in the magnetic field transmitter 202 must be larger than the number of degrees of freedom required for tracking the object.

Processor 214 is coupled with memory 212, with magnetic field detector 204, and with mechanical arm interface 210. Processor 214 is, optionally, further coupled with magnetic field transmitter 202 (i.e., magnetic filed transmitter 202 may operate independently of processor 214. When processor 214 is not coupled with magnetic field transmitter 202 then processor 214 requires information regarding the operation of magnetic field transmitter 202 (e.g., transmission frequency, transmission power, duty cycle and the like). Magnetic field detector 204 is coupled with mapping handle 206. Mapping handle 206 is coupled with mechanical arm 208. Mechanical arm 208 is coupled with mechanical arm interface 210. Mechanical arm 208 includes a plurality of actuator (not shown) enabling mechanical arm 208 to freely move to a plurality of poses (i.e., locations or orientations or both) within a volume of interest 216. Since mechanical arm 208 freely moves within volume of interest 216 mapping handle 206 and thus magnetic field detector 204 is freestanding. Magnetic field transmitter 202, and thus magnetic field 218 are associated with a magnetic coordinate system 220. Memory 212 stores a magnetic field model. Volume of interest 216 is associated with a volume coordinate system 222.

Magnetic field transmitter 202 generates a magnetic field 218 toward volume of interest 216. Processor 214 directs mechanical arm interface 210 to freely move mechanical arm 208 (i.e., the trajectory of the mechanical arm 208 from one pose in the volume of interest to another pose in the volume of interest has no constraints thereupon) within volume of interest 216 either randomly or to a plurality of regions of interest. Magnetic field detector 204 measures the magnetic flux at a plurality of poses. As described above, in conjunction with FIGS. 1 and 2, processor 214 iteratively estimates the parameters of the magnetic field model by estimating the poses of magnetic field detector 204 and using the poses estimations to estimate the parameters of the magnetic field model. Processor 214 may repeat this iterative process for a predetermined number of times or until a desired degree of accuracy is achieved. Processor 214 stores the estimated parameters in memory 212. It is noted that mechanical arm 208 is brought herein as an example. In generally, any mechanical support capable of moving through a plurality of poses in the volume of interest is suitable. It is noted that mechanical arm 208 may be replaced with any mechanical support capable of moving to a plurality of poses within volume of interest 216. For example, magnetic field detector 204 may be coupled with gimbals, mounted on tracks, capable of rotating in three dimensions and capable of moving in three dimensions.

When a magnetic tracking system according to the disclosed technique tracks the pose of an object in a reference coordinate system (e.g., the coordinate system associated with a cockpit of an aircraft or the coordinate system of an image), the system registers the magnetic coordinate system with the reference coordinate system. In other words, the system determines a correspondence between the poses (i.e., location or orientation or both) relative to the magnetic coordinate system and the poses relative to the reference coordinate system. Thus each pose determined by the magnetic tracking system, relative to the magnetic coordinate system, has a corresponding pose relative to the reference coordinate system. The system may register the magnetic coordinate system with a reference coordinate system for example, by placing the magnetic field detector at a known pose, relative to the reference coordinate system, and determine the pose of the magnetic field detector relative to the magnetic coordinate system. Alternatively, when the pose of the magnetic field transmitter, relative to the reference coordinate system, is known, each pose relative to the magnetic coordinate system is associated with a respective pose relative to the reference coordinate system. Thus, each determined pose of transmitter in the magnetic coordinate system has an associated pose in the reference coordinate system.

According to another embodiment of the disclosed technique, an imager is affixed on the freestanding mapping handle. The camera acquires at least one image of articles having known poses relative to the reference coordinate system. The processor estimates the pose (i.e., as mentioned above, either location or orientation or both) of the magnetic field detector relative to the magnetic coordinate system and the pose of the camera relative to the reference coordinate system. Since the spatial relationship between the camera and the magnetic field detector is known, the processor determines the correspondence between the reference coordinate system and the magnetic coordinate system.

Figure 4:
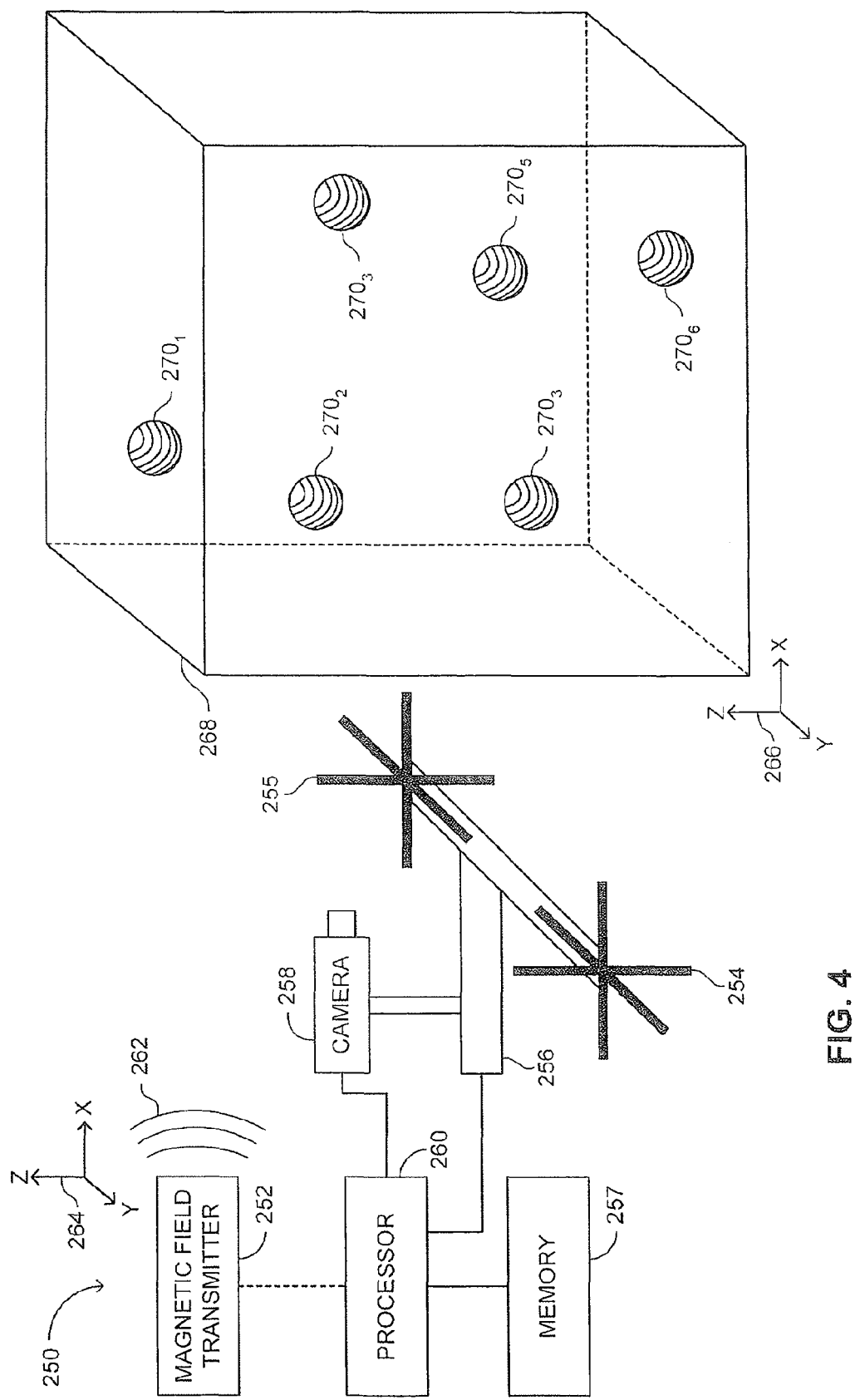
FIG. 4 is a schematic illustration of a system for mapping a magnetic field in a volume of interest, constructed and operative in accordance with another embodiment of the disclosed technique.

Reference is now made to FIG. 4, which is a schematic illustration of a system, generally referenced 250, for mapping a magnetic field in a volume of interest, constructed and operative in accordance with another embodiment of the disclosed technique. System 250 includes a magnetic field transmitter 252, a first magnetic field detector 254, a second magnetic field detector 255, a freestanding mapping handle 256, a memory 257, an imager 258, and a processor 260. System 250 may further include a guide (not shown) similar to the guide 160 described hereinabove conjunction with FIG. 2. Magnetic field transmitter 252 include one ore more (e.g., three) magnetic field generators (e.g., coils with electric current flowing there through—not shown). Each magnetic field generator generates a magnetic field which is uniquely identifiable (e.g., each magnetic field has a unique frequency or each magnetic field is generated at a different time). Each of First magnetic field detector 254 and second magnetic field detector 255 include one or more (e.g., three) magnetic field sensors (e.g., coils with electric current induced therein, hall-effect sensors). As mentioned above, for the purpose of mapping a magnetic field, the total number of magnetic field sensors in first magnetic field detector 254 and second magnetic field detector 255, times the number of magnetic field generators in magnetic field transmitter 252, must be larger than the number of degrees of freedom required for tracking the object. Imager 258 may be a camera operating, for example, in the Infrared (IR) spectrum or in the visual spectrum or any other desired spectrum. Imager 258 may further be a medical imager (e.g., X-ray). The spatial relationship (i.e., the relative pose), between first magnetic field detector 254 and second magnetic field detector 255, is known and stored in memory 207.

Processor 260 is coupled with first magnetic field detector 254 and with second magnetic field detector 254, with memory 257 and with imager 258. Processor 260 is, optionally, further coupled with magnetic field transmitter 252 (i.e., magnetic filed transmitter 252 may operate independently of processor 260). When system 250 includes a guide, the guide is also coupled with processor 260. First magnetic field detector 254, second magnetic field detector 255 and camera 258 are firmly coupled with freestanding mapping handle 256. Thus, first magnetic field detector 254, second magnetic field detector 255 and imager 258 are also freestanding. Magnetic field transmitter 252, and thus magnetic field 262 are associated with a magnetic coordinate system 264. Memory 257 stores a magnetic field model. Volume of interest 268 is associated with a reference coordinate system 266.

Magnetic field transmitter 252 generates a magnetic field 262 toward a volume of interest 268. An operator (not shown) holds freestanding mapping handle 256 in her hand. The operator freely moves freestanding mapping handle 256 (i.e., the trajectory of the mapping handle 256, from one pose in the volume of interest to another pose in the volume of interest, has no constraints thereupon), and thus first magnetic field detector 254, second magnetic field detector 255 and imager 258 within volume of interest 268. First magnetic field detector 254 and second magnetic field detector 255 measure the magnetic flux at a plurality of poses (i.e., locations or orientations or both). Processor 260 determines the magnetic field vector corresponding to each pose according to the measurements of the magnetic field flux. Processor 260 estimates the poses of first magnetic field 254 and second magnetic field detector 255, relative to magnetic coordinate system 264, according to the determined corresponding magnetic field vectors. Thus, processor 260 estimates the pose of mapping handle 256 and consequently of imager 258. Since the spatial relationship between first magnetic field detector 254 and second magnetic field 255 is known, the pose estimates of first magnetic field detector 254 and second magnetic field detector 255 must comply (i.e., within a determined degree of accuracy) with the known relative pose, between first magnetic field detector 254 and second magnetic field detector 255 (i.e. due to the firm coupling of first magnetic field detector 254 and second magnetic field detector 255 with freestanding mapping handle 256). In other words, the known relative pose, between first magnetic field detector 254 and second magnetic field detector 255, introduces constraints to the pose estimations thereof. These added constraints improve the accuracy of the estimated poses. Processor 260 estimates the parameters characterizing the magnetic field model. Processor 260 stores the estimated parameters in memory 257.

When no previous model of the magnetic field exist, processor 260 estimates the poses of first magnetic field detector 254 and second magnetic field detector 255 relative to magnetic coordinate system 264, according to a generic model of magnetic field 262 (e.g., a model of one or more magnetic dipoles) stored in memory 257. Processor 260 uses these pose estimations to estimate the parameters characterizing the magnetic field model of magnetic field 262. Processor 260 estimates the parameters characterizing the magnetic field model according to deviations between the measurements of the magnetic field flux and predictions of the magnetic field flux, at the estimated poses (i.e., locations or orientations or both), determined according to the stored magnetic field model (i.e., the magnetic field that is stored in memory 257). Thus, processor 260 estimates a new magnetic field model and stores this new model in memory 257 instead of the previous model. Processor 260 may use the new estimated magnetic field model to re-estimate the poses of first magnetic field detector 254 and second magnetic field detector 255 (i.e., relative to magnetic coordinate system 264) and use these re-estimated poses to re-estimate the parameters characterizing the magnetic field model. Processor 260 may repeat this iterative process for a predetermined number of times or until a desired degree of accuracy is achieved. Processor 260 stores the estimated parameters in memory 257.

Prior, during or after the estimation of the magnetic field model, imager 258 acquires an image of articles $270_1$, $270_2$, $270_3$, $270_4$, $270_5$ and $270_6$ and provides this acquired image to processor 260. Memory 257 stores the poses of articles $270_1$-$270_6$, relative to reference coordinate system 266. Processor 260 determines the pose of imager 258 and thus, the pose of mapping handle 256, first magnetic field detector 254 and second magnetic field detector 256, relative to reference coordinate system 266, according to the acquired image of articles $270_1$-$270_6$ (i.e., since imager 258, first magnetic field detector 254 and second magnetic field detector 256 are all firmly coupled with freestanding mapping handle 256).

The number of articles $270_1$-$270_6$ (i.e., six) is brought herein as an example. It is noted that articles $270_1$-$270_6$ are optically detectable articles that may typically exist in volume of interest 268 (e.g., boresight reference unit placed closed to detectable volume). Alternatively, articles $270_1$-$270_6$ may be optically detectable articles specially placed in volume of interest 268 (e.g., fiducials or Light Emitting Diodes emitting light in the IR or visual spectrums). The term optically detectable articles relates herein to articles that either emit or reflect light in the operating spectrum of imager 258. It is noted that articles $270_1$-$270_6$ may exhibit no rotational symmetry or partial rotational symmetry. Thus, processor 260 can determine the azimuth the elevation and the roll angles of imager 258, relative to the reference coordinate system, according to an image of one article only.

Alternatively, mapping handle 256 may be coupled with a mechanical arm (not shown) such as mechanical arm 208 (FIG. 3). The mechanical arm interface provides processor 260 with information regarding the pose of the tip of mechanical arm relative to reference coordinate system 226 (e.g., according to the pose of the base of mechanical arm 208 the geometry of mechanical arm 208 and the state of the actuators of mechanical arm 208). Thus, processor 260 determines the pose of magnetic field detector 254 relative to reference coordinated system 266.

Magnetic field detector 254 measures the magnetic field flux. Processor 260 determines, accordingly, the pose of magnetic field detector 254, relative to magnetic coordinate system 264. Since processor 264 determines the pose of magnetic field detector 254 relative to both reference coordinate system 266 and magnetic coordinate system 264 processor 260 therefore, determines the correspondence between reference coordinate system 266 and magnetic coordinate system 264. Thus, processor 260 registers reference coordinate system 266 with magnetic coordinate system 264.

In general, processor 260 registers the magnetic coordinated system with the reference coordinate system, by determining the pose (i.e., location or orientation or both) of the magnetic field detector in the reference coordinate system. Accordingly, for example, processor 260 determines the orientation of magnetic field detectors 254 and 255 in reference coordinate system 222, according to the following set of equations represented in matrix from:

$$[\text{HRPToDRPPos}] \cdot [\text{DRPPos}] \cdot [\text{ModelPos}] = [\text{HRPPos}] \quad (1)$$

Equation (1) relates to registration of orientation only. A similar equation may by used for registering the location of first and second magnetic field detectors 254 and 255 in reference coordinate system 222. In equation (1), HRPToDRPPos denotes relative pose between a Handle Reference Point (HRP, not show) and a Detector Reference Point (DRP, also not shown). HRP is a point on mapping handle 256 according to which the pose of mapping handle 256, in reference coordinate system 266, is determined. DRP is a point on mapping handle 256 with known relative pose between the DRP and each of first and second magnetic field detectors 254 and 255 (i.e., the DRP may be one of magnetic field detectors 254 or 255 since the relative pose between magnetic field detector 254 and 255 is know). DRPPos denotes the pose of the DRP in magnetic coordinate system 264 and is determined according to the measurements made by first and second magnetic field detectors 254 and 255. ModelPos denotes the transformation between magnetic coordinate system 264 and the reference coordinate system 266. HRPPos denotes the pose of the HRP in reference coordinate system 266 and is determined according to the images acquired by imager 258. The symbol '·' denotes matrix multiplication.

Processor 256 determines HRPPos according to images of articles $270_1$, $270_2$, $270_3$, $270_4$, $270_5$, $270_6$, (i.e., located in volume of interest 266), acquired by imager 258. Imager 258 is affixed to the mapping handle at a known relative pose to the HRP. Alternatively, imager 258 may be affixed in volume of interest 268. Thus, the pose of imager 258 in reference coordinate system 222 is also known. Processor 256 determines HRPPos according to images, acquired by imager 258, of articles (not shown) located on mapping handle 256 with a known relative pose to the HRP. The articles on mapping handle 256 are optically detectable articles that may typically exist on mapping handle 256 (e.g., the tip thereof). Alternatively, the articles on mapping handle 256 may be optically detectable articles specially placed on mapping handle 256 (e.g., fiducials or Light Emitting Diodes).

When HRPToDRPPos is known, processor 260 determines ModelPos only (i.e., since HRPPos is determined according to the images acquired by the imager), and only one article is needed (i.e. this article exhibits no rotational symmetry or partial rotational symmetry such as a crosshair, enabling processor 260 to determine the three orientation angles). When HRPToDRPPos is unknown, processor 260 determines HRPToDRPPos as well and a minimum of three articles are needed. In general, Equation (1) is a non-linear set of equations which can be solved, for example, according to the Newton-Raphson Method.

Reference is now made to FIG. 5A which is a schematic illustration of a mapping handle, generally reference 300 and a magnetic field detector, generally referenced 302, constructed and operative in accordance with another embodiment of the disclosed technique. Magnetic field detector 302 includes one magnetic field sensor 304 (e.g., a coil). Magnetic field detector 302 is coupled with mapping handle 300. As mentioned above, in general, the number of magnetic field generators times the number of sensors should be larger than the number of required location and orientation parameters. Therefore, to map the magnetic field and determine the parameters of a magnetic field model, used to determine both location and orientation of a tracked object, a magnetic field transmitter which includes at least seven magnetic field generators is required. Thus, there are more generator detector pairs than there are pose parameters, which define an overdetermined set of equations (i.e., there are more equations than there are unknowns). Therefore, this set of equations includes additional information relating to the deviations between the magnetic field predicted by the magnetic field model and the magnetic field measured by magnetic field detector 302.

Reference is now made to FIG. 5B which is a schematic illustration of a mapping handle, generally reference 310 and a magnetic field detector, generally referenced 312, constructed and operative in accordance with a further embodiment of the disclosed technique. Magnetic field detector 312 includes two magnetic field sensors 314 and 316. Magnetic field detector 312 is coupled with mapping handle 310. To map the magnetic field and determine the parameters of a magnetic field model a magnetic field transmitter which employs at least four magnetic field generators is required. Thus, there are more generator detector pairs than there are pose parameters, which define an over-determined set of equations (i.e., there are more equations than there are unknown). Therefore, this set of equations includes additional information relating to the deviations between the magnetic field predicted by the magnetic field model and the magnetic field measured by magnetic field detector 312.

Reference is now made to FIG. 5C which is a schematic illustration of a mapping handle, generally reference 320 and a magnetic field detector, generally referenced 322, constructed and operative in accordance with a further embodiment of the disclosed technique. Magnetic field detector 322 includes three magnetic field sensors 324, 326 and 328. Magnetic field detector 322 is coupled with mapping handle 320. To map the magnetic field and determine the parameters of a magnetic field model a magnetic field transmitter which employs at least three magnetic field generators is required. Thus, there are more generator detector pairs than there are pose parameters, which define an over-determined set of equations (i.e., there are more equations than there are unknown). Therefore, this set of equations includes additional information relating to the deviations between the magnetic field predicted by the magnetic field model and the magnetic field measured by magnetic field detector 322.

Reference is now made to FIG. 5D which is a schematic illustration of a mapping handle, generally reference 330 and two magnetic field detector, generally referenced 332 and 334, constructed and operative in accordance with another embodiment of the disclosed technique. Each of magnetic field detectors 332 and 334 include one magnetic field sensor 336 and 338 respectively. Each of magnetic field detectors 335 and 334 is coupled with mapping handle 300. The spatial relationship (i.e., the relative location and orientation), between magnetic field detector 332 and magnetic field detector 334, is known. Therefore, to map the magnetic field and determine the parameters of a magnetic field model a magnetic field transmitter which employs at least four magnetic field generators is required. Thus, there are more generator detector pairs than there are pose parameters, which define an over-determined set of equations (i.e., there are more equations than there are unknown). Therefore, this set of equations includes additional information relating to the deviations between the magnetic field predicted by the magnetic field model and the magnetic field measured by magnetic field detectors 332 and 334. Furthermore, the known spatial relationship between magnetic field detectors 332 and 334 introduces additional constraints on the determined poses of magnetic field detectors 332 and 334 during the mapping process.

Reference is now made to FIG. 5E which is a schematic illustration of a mapping handle, generally reference 340 and two magnetic field detectors, generally referenced 342 and 344, constructed and operative in accordance with another embodiment of the disclosed technique. Each of magnetic field detectors 342 and 344 include three magnetic field sensors. Magnetic field detector 342 includes magnetic field sensors 346, 348 and 350. Magnetic field detector 344 includes magnetic field sensors 352, 356 and 354. Each of magnetic field detectors 342 and 344 is coupled with mapping handle 340. The spatial relationship (i.e., the relative location and orientation), between magnetic field detector 342 and magnetic field detector 344, is known. To map the magnetic field and determine the parameters of a magnetic field model a magnetic field transmitter which employs at least two magnetic field generators is required. Thus, there are more generator detector pairs than there are pose parameters, which define an over-determined set of equations (i.e., there are more equations than there are unknown). Therefore, this set of equations includes additional information relating to the deviations between the magnetic field predicted by the magnetic field model and the magnetic field measured by magnetic field detectors 342 and 344. Furthermore, the known spatial relationship between magnetic field detectors 342 and 344 introduces additional constraints on the determined poses of magnetic field detectors 342 and 344 during the mapping process.

Figure 6:
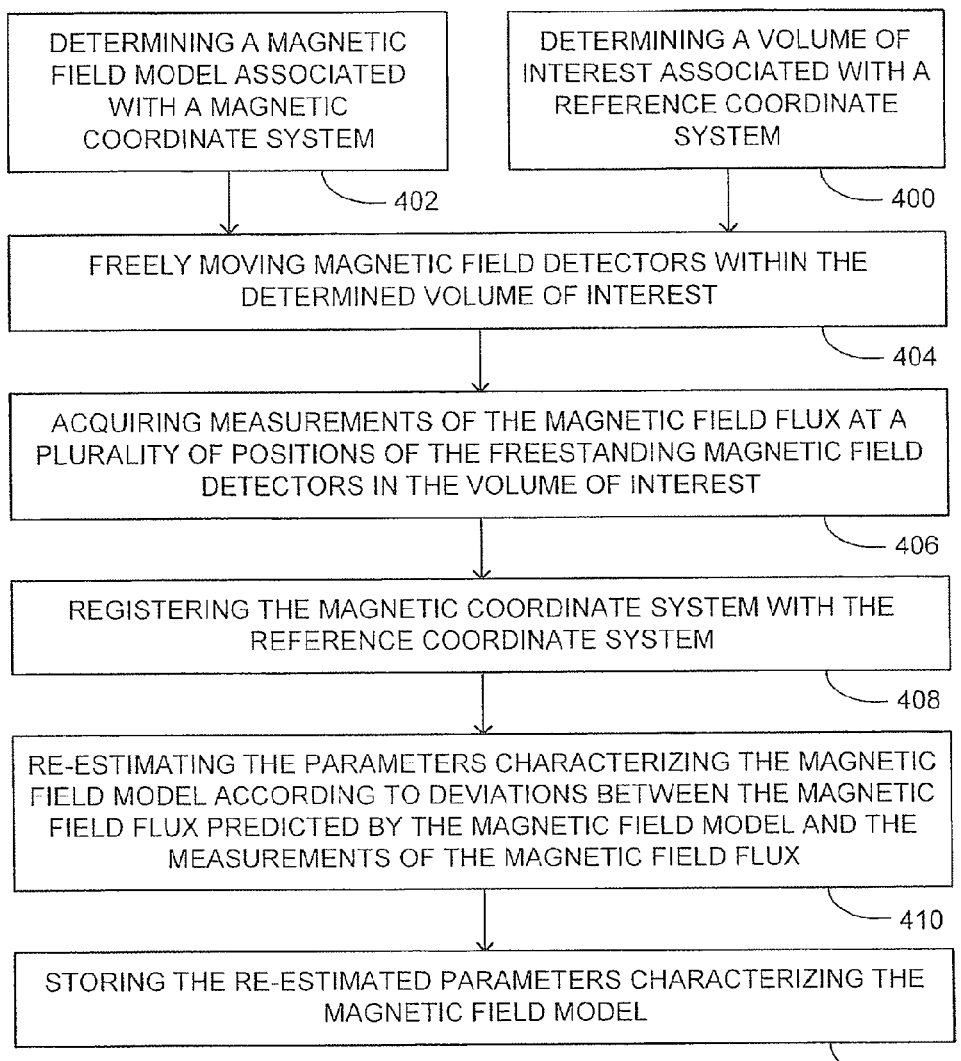
FIG. 6 is a schematic illustration of a method for mapping a magnetic field in accordance with another embodiment of the disclosed technique.

Reference is now made to FIG. 6, which is a schematic illustration of a method for mapping a magnetic field in accordance with another embodiment of the disclosed technique. In procedure 400, a volume of interest is determined. The volume of interest is associated with a reference coordinate system. For example, the volume of interest is a cockpit of an aircraft. The volume of interest may further be the body of a patient or a room.

In procedure 402, a magnetic field models is determined. The magnetic field model is associated with a magnetic coordinate system. This model may be a physical model or a mathematical model. The magnetic field model includes parameters characterizing the model. In general, when the model is a physical model, the parameters are physical parameters of the magnetic field. With reference to FIG. 1, memory 107, stores the parameters characterizing the determined magnetic field model.

In procedure 404, magnetic field detectors are freely moved within the determined volume of interest. The magnetic field detectors may be moved in the volume of interest at a random trajectory. Alternatively, the magnetic field detectors may be freely guided towards regions of interest within the volume of interest. With reference to FIG. 1, operator 116 freely moves first magnetic field detector 104 and second magnetic field detector 104 within volume of interest 118 in a random trajectory 120. With reference to FIG. 2, guide 160 guides operator 168 to freely move magnetic field detector 154 through regions of interest $172_1$-$172_R$. With reference to FIG. 3, mechanical arm interface 210 directs mechanical arm 208 to freely move within volume of interests either at a random trajectory or through a plurality of regions of interest.

In procedure 406, measurements of the magnetic field flux, at a plurality of poses in the volume of interest, are acquired. When the magnetic field detector is moved in a random trajectory in the volume of interest, then, the measurements of the magnetic field flux are acquired at a plurality of poses on the random trajectory. When the magnetic field detector is guided toward regions of interest in the volume of interest, then, the measurements of the magnetic field flux are acquired at a plurality of poses in the regions of interest. With reference to FIG. 1, magnetic field detector 104 acquires measurements of the magnetic field flux at a plurality of poses $122_1$-$122_N$ on trajectory 120. With reference to FIG. 2, magnetic field detector 154 acquires measurements of the magnetic field flux at a plurality of poses in regions $172_1$-$172_R$.

In procedure 408 the magnetic field coordinate system is registered with the reference coordinate system. Reference coordinate system is registered with the magnetic coordinate system by optically determining the pose (i.e., location or orientation or both) of a magnetic field detector relative to the reference coordinate system and determining the pose of the magnetic field detector relative to the magnetic coordinate system. When the location of the magnetic field transmitter, in the reference coordinate system is known, reference coordinate system is registered with the magnetic coordinate system by optically determining the orientation of a magnetic field detector in the reference coordinate system. It is noted that registering the magnetic field coordinate system with the reference coordinate system may be performed either prior, during or after the procedure of acquiring measurements of the magnetic field flux. When using the poses determined according to the imagers acquired by the imager as constraint on the poses determined according to the measurements of the magnetic field detector, then, the imager acquires the images before the magnetic field model estimation. With reference to FIG. 4, processor 260 determines the pose of first magnetic field detector 254 and second magnetic field detector 255 relative to magnetic coordinate system 264 according to the measurements of the magnetic flux in first magnetic field detector 254 and second magnetic field detector 255. Processor 260 determines the pose of first magnetic field detector 254 and second magnetic field detector 255 relative to reference coordinate system 266 according to an image of article $270_1$-$270_6$ acquired by imager 258.

In procedure 410, the parameters characterizing the magnetic field model are re-estimated according to deviations between the magnetic field flux predicted by the magnetic field model and the measurements of the magnetic field flux. The parameters are estimated iteratively as further explained below in conjunction with FIG. 7. It is noted that when the magnetic coordinate system is registered with the reference coordinate system the parameters characterizing the magnetic field model are estimated with reference to the reference coordinate system. However, the parameters characterizing the magnetic field model may be estimated with reference to the magnetic coordinate system or any other coordinate system. The registration between the magnetic or the other coordinate system with the reference coordinate system may be performed at a later stage. It is further noted that, when registration between the reference coordinate system and the magnetic coordinate system is performed during the mapping of the magnetic field, then, the optical pose measurements may be used in conjunction with the magnetic field measurements for mapping the magnetic field (e.g., as constraints on the pose of the magnetic field detector). With reference to FIG. 1, processor 108 estimates the parameters of the magnetic field model according to the measurements of the magnetic field flux.

In procedure 412, the re-estimated parameters, characterizing the magnetic field model, are stored. Thereby, a re-estimated magnetic field model is stored instead of the previously stored magnetic field model. With reference to FIG. 1, processor 108 stores the estimated parameters characterizing the magnetic field model in memory 107.

As mentioned above parameters characterizing the magnetic field may be iteratively estimated according to deviations between the measurements of the magnetic field flux and predictions of the magnetic field flux, at the estimated poses. Accordingly, the poses of the magnetic field detector are estimated according to an initially stored magnetic field model. The parameters characterizing the magnetic field model are estimated according to the estimated poses of the magnetic field detector. The parameters of the magnetic field may be re-estimated using the estimated poses of the magnetic field detector and the previously estimated magnetic field model. This process may be repeated for a predetermined number of times or until a desired degree of accuracy is achieved.

Figure 7:
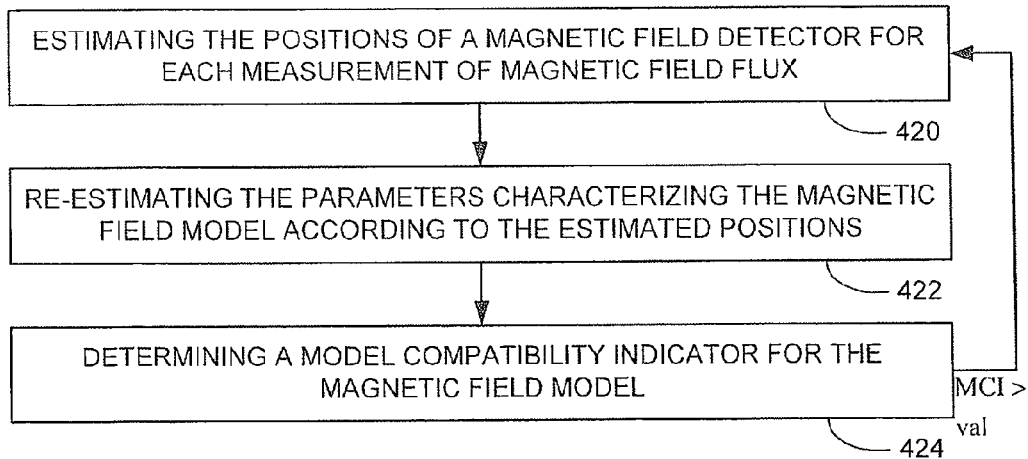
FIG. 7 is a schematic illustration of an exemplary method for estimating the parameters of a magnetic field, in accordance with a further embodiment of the disclosed technique.

Reference is now made to FIG. 7, which is a schematic illustration of an exemplary method for estimating the parameters of a magnetic field, in accordance with a further embodiment of the disclosed technique. In procedure 420, the pose of the magnetic field detector is estimated for each measurement of magnetic field flux according to the stored magnetic field model. The poses of the magnetic field detector, relative to the magnetic coordinate system, are estimated, for example, by minimizing the squared differences between the measurements of the magnetic field flux and predictions of the magnetic field flux (i.e., predicted by the stored magnetic field model). This is stated mathematically as follows:

$$\underset{\overline{P},\overline{O}}{\arg\text{Min}}[\overline{M}_j - \overline{f}(\theta, \overline{P}_j, \overline{O}_j)]^2 \quad (1)$$

wherein $\overline{P}_j$ is the location vector at pose j (e.g., pose $122_j$ in FIG. 1), $\overline{O}_j$ is the orientation vector at one of pose j, $\overline{M}_j$ is the measurement matrix of the magnetic field at pose j, $\overline{f}(\theta,\overline{P}_j,\overline{O}_j)$ is the magnetic field model and θ is a set parameters characterizing the model. $\overline{f}(\theta,\overline{P}_j,\overline{O}_j)$ determines the dependency between the magnetic field measurements, the parameters (i.e., θ) of the magnetic field model and the dependency between the magnetic field measurements and the poses of the magnetic field detector. The parameters θ of $\overline{f}(\theta,\overline{P}_j,\overline{O}_j)$ may describe for example, a set of dipoles or coefficients of a polynomial function. Explicit expressions for $\overline{f}(\theta,\overline{P}_j,\overline{O}_j)$ are derivatives of Maxwell's equations. With reference to FIG. 1, processor 108 estimates the pose of mapping handle 106.

In procedure 422, the parameters characterizing the magnetic field model are re-estimated according to the estimated poses. The parameters of the magnetic field model are estimated according to the deviations between the measurements of the magnetic field flux and predictions of the magnetic field flux, at the estimated poses, for example, by minimizing the sum of squared differences there between. This is stated mathematically as follows:

$$\underset{\theta}{\arg\text{Min}}\sum_{j=1}^{N}[\overline{M}_j - \overline{f}(\theta, \overline{P}_j, \overline{O}_j)]^2 \quad (2)$$

wherein N is the total number of locations. With reference to FIG. 1, processor 108 re-estimates the parameters of the magnetic field model according to the estimated poses.

In procedure 424, a 'model compatibility indicator' is determined. This model compatibility indicator represents the deviations between the magnetic field model and the actual magnetic field in the volume of interest. When the model compatibility indicator is larger then a determined value, designated as 'MCI' in FIG. 7, then, the method returns to procedure 420. When the model compatibility indicator is smaller or equal to the determined value, then, the estimated parameters stored. One exemplary model compatibility indicator is a cost function such as a Figure of Merit (FOM). This FOM represents, for example, the ratio between the difference between the measurements of the magnetic field flux and the prediction of the magnetic field flux according to the model, and the measurements of the magnetic field flux. This exemplary FOM is stated mathematically as follows:

$$FOM = \sqrt{\frac{\sum_{i=1}^{k}[M_{ji} - f_i(\theta, \overline{P}_j, \overline{O}_j)]^2}{\sum_{i=1}^{k} M_{ji}^2}} \quad (3)$$

wherein k is the number of generator sensor pairs (e.g., in the case of three generators and three sensors there are nine generator sensor pairs), $M_{ji}$ is the measurement, at pose j, of the magnetic field generated by one of the generator and sensed by one of the sensors. Furthermore, $f_i(\theta,\overline{P}_j,\overline{O}_j)$ is the magnetic field at pose j of the $i^{th}$ generator sensor pair, according to the magnetic field model. Another exemplary model compatibility indicator is the reciprocal of the number of repetition of the method (i.e., how many times the parameters characterizing the magnetic field model have been re-estimated). Yet another exemplary model compatibility indicator is the deviations between the poses of the magnetic field detector, determined according to the magnetic field model, and the poses of the magnetic field detector determined according to the images acquired by the imager. With reference to FIG. 1, processor 108 determines a model compatibility indicator of the magnetic field model for all poses of magnetic field receiver 104.

Still referring to FIG. 7, it is noted that determining the parameters of the magnetic field model and estimating the pose of the magnetic field detector may be performed simultaneously by, solving a set of equations which includes all the desired unknowns (i.e., pose parameters and model parameters). It is further noted that if the estimation of the parameters of the magnetic field does not converge, then, a different magnetic model having different parameters and coefficients may be determined and used.

The systems of FIGS. 1, 2, 3, and 4 are described hereinabove with a configuration wherein the magnetic field transmitter is fixed at a known pose in the volume of interest and the magnetic field detector is mounted on the tracked object. However, it is noted that the systems of FIGS. 1, 2, 3 and 4 may employ the configuration wherein the magnetic field transmitter is mounted on the mapping handle and the magnetic field detector is fixed at a known pose in the volume of interest. Furthermore, prior knowledge of the volume of interest may provide additional information regarding the possible orientations of the magnetic field detector. For example, there may be locations in a cockpit wherein the magnetic field detector can move only at unique orientations. The knowledge of these orientations provides further constraints to the estimated orientations at those locations. As another example, accelerometers may be coupled with the freestanding mapping handle. These accelerometers provide information regarding the direction and the distance the magnetic field detector traversed between two consecutive measurements. The estimated poses, of the magnetic field detector, at these two consecutive measurements must be consistent with the direction and distance determined according to the measurements from the accelerometers.

It will be appreciated by persons skilled in the art that the disclosed technique is not limited to what has been particularly shown and described hereinabove. Rather the scope of the disclosed technique is defined only by the claims, which follow.

The invention claimed is:

1. A system for mapping a magnetic field in a volume of interest, the system comprising:
a magnetic field transmitter, including at least one magnetic field generator, generating a magnetic field in the volume of interest;
at least one freestanding magnetic field detector, including at least one magnetic field sensor, operative to freely move within said volume of interest, said at least one freestanding magnetic field detector acquiring measurements of flux of said magnetic field at a plurality of poses; and
a processor, coupled with said magnetic field detector, said processor re-estimating parameters characterizing said magnetic field model according to deviations between said measurements of said flux of said magnetic field and according to predictions of said flux, said predictions being determined according to a stored magnetic field model, thereby, said processor estimating a new magnetic field model,
wherein the number of the generators times the number of the sensors is larger than the number of degrees of freedom required to track an object in said volume of interest, which provides additional information relating to the deviations between the magnetic field predicted by said stored magnetic field model and said measurements of said flux of said magnetic field,
wherein said processor employs said additional information when re-estimating said parameters characterizing said magnetic field model, and
wherein, the combined number of said at least one magnetic field generator and said least one magnetic field sensor is at least three.

2. The system according to claim 1, further including a freestanding mapping handle operative to freely move within said volume of interest, said at least one freestanding magnetic field detector being firmly coupled with said freestanding mapping handle.

3. The system according to claim 2, further including a mechanical arm, said mapping handle being coupled with said mechanical arm.

4. The system according to claim 3, further including a mechanical arm interface coupled with said processor and with said mechanical arm, said processor directing said mechanical arm interface to freely move mechanical arm within said volume of interest.

5. The system according to claim 1, wherein said processor is further coupled with said magnetic field transmitter.

6. The system according to claim 1 further including a memory coupled with said processor, said memory storing said stored magnetic field model, said memory further stores said new magnetic field model with said new magnetic field model instead of said stored magnetic field model, thereby said new magnetic field model becomes said stored magnetic field model.

7. The system according to claim 1, wherein said at least one freestanding magnetic field detector is moved within said volume of interest at a random trajectory.

8. The system according to claim 1, wherein said at least one freestanding magnetic field detector is moved within said volume of interest through a plurality of mapping regions.

9. The system according to claim 1, further including a guide, said guide guiding an operator to freely move freestanding magnetic field detector within said volume of interest.

10. The system according to claim 9, wherein said guide guides said operator to freely move freestanding magnetic field detector within said volume of interest at a random trajectory.

11. The system according to claim 9, wherein said guide guides said operator to freely move freestanding magnetic field detector within said volume of interest through a plurality of mapping regions.

12. The system according to claim 11, wherein said guide is a display displaying representations of said mapping regions and freestanding mapping magnetic field detector, said representations being marked when said magnetic field detector passes there through.

13. The system according to claim 9, wherein said guide sounds audio signals corresponding to directions.

14. The system according to claim 1, further including an imager coupled with said at least one freestanding magnetic field detector, said imager acquiring at least one image of articles present within said volume of interest, said processor determines the poses of said imager and said at least one freestanding magnetic field detector in a reference coordinates system according to said at least one image and the known pose of said articles in said reference coordinate system.

15. The system according to claim 14, wherein said processor registers said magnetic coordinate system and said reference coordinate system according the determined poses said at least one freestanding magnetic field detector in said magnetic coordinate system and said reference coordinate system.

16. The system according to claim 1, wherein said system comprises at least two magnetic field detectors.

17. The system according to claim 16, wherein each of said magnetic field detectors includes three magnetic field transmitters.

18. The system according to claim 16, wherein the spatial relationship between said two magnetic field detectors is known.

19. The system according to claim 1, wherein said processor re-estimates said parameters characterizing said magnetic field model by estimating said plurality of positions, relative to a magnetic coordinate system, according to said measurements and according to said stored magnetic field model, said processor re-estimating parameters characterizing said stored magnetic field model according to deviations between said measurements of said flux of said magnetic field and according to predictions of said flux at said estimated positions, thereby said processor estimates a new magnetic field model.

20. The system according to claim 1, wherein said magnetic field transmitters includes three magnetic field generators.

21. A method for mapping a magnetic field in a volume of interest, the method comprising procedures of:
    freely moving at least one magnetic field detector within a volume of interest, said magnetic field detector including at least one magnetic field sensor;
    acquiring measurements of magnetic field flux at a plurality of poses of the freestanding magnetic field detectors in the volume of interest, the magnetic field being generated by and magnetic field transmitter, said magnetic field transmitter including at least one magnetic field generator; and
    re-estimating parameters characterizing a magnetic field model, according deviations between said measurements of said magnetic field flux and predictions of said magnetic field flux at said poses of said at least one magnetic field detector,
    wherein, the number of the generators times the number of the sensors is larger than the number of degrees of freedom required to track an object in said volume of interest, which provides additional information relating to the deviations between the magnetic field predicted by said stored magnetic field model and said measurements of said flux of said magnetic field,
    wherein said processor employs said additional information when re-estimating said parameters characterizing said magnetic field model, and
    wherein, the combined number of said at least one magnetic field generator and said least one magnetic field sensor is at least three.

22. The method according to claim 21, further including a preliminary procedure of determining a magnetic field model associated with a magnetic coordinate system.

23. The method according to claim 21, further including a preliminary procedure of determining a volume of interest associated with a reference coordinate system.

24. The method according to claim 21, further including a procedure of registering said magnetic coordinate system and said reference coordinate system.

25. The method according to claim 24 wherein said registering is performed by optically determining the pose of said at least one magnetic field detector relative to said reference coordinate system and determining the pose of said at least one magnetic field detector relative to the magnetic coordinate system.

26. The method according to claim 21, wherein said procedure of re-estimating parameters of a magnetic field model includes the sub-procedures of:
    estimating said poses of said at least one magnetic field detector for each said measurement of said magnetic field flux according to said magnetic field model;
    re-estimating parameters characterizing said magnetic field model according to said estimated poses thereby re-estimating said magnetic field model;
    determining a model compatibility indicator of said magnetic field model; and
    repeating from said procedure of estimating said poses when said model compatibility indicator is above a determined value.

27. The method according to claim 26 wherein said procedure of estimating said poses is performed by minimizing the squared differences between said measurements of said magnetic field flux and predictions of said magnetic field flux predicted by said previously stored magnetic field model.

28. The method according to claim 26, wherein said parameters characterizing said magnetic field model are estimated according to the deviations between said measurements of the magnetic field flux and predictions of said magnetic field flux, at said estimated poses said prediction of said magnetic field flux being determined according to said previously stored magnetic field model.

29. The method according to claim 28, wherein said deviations are determined by minimizing the sum of squared differences between said measurements of said magnetic field flux and said predictions of said magnetic field flux, at said estimated poses, said predictions are determined according to the stored magnetic field model.

30. The method according to claim 26, wherein said model compatibility indicator is a figure of merit.

31. The method according to claim 26, wherein said model compatibility indicator is the reciprocal of the number of repetitions from said procedure of estimating said poses.

32. The method according to claims 21, further including the procedure of storing the re-estimated parameters characterizing said magnetic field model, thereby storing a re-estimated magnetic field model instead of said previously stored magnetic field model.

33. A system for mapping a magnetic field in a volume of interest, the system comprising:
    a magnetic field transmitter, including at least one magnetic field generator, generating a magnetic field in the volume of interest;
    two freestanding magnetic field detectors, firmly coupled with a freestanding mapping handle, each of said two freestanding magnetic field detectors including at least one magnetic field sensor, said two freestanding magnetic field detectors operative to freely move within said volume of interest, said two freestanding magnetic field detectors acquiring measurements of flux of said magnetic field at a plurality of poses; and a processor, coupled with said magnetic field detector, said processor re-estimating parameters characterizing said magnetic field model according to deviations between said measurements of said flux of said magnetic field and according to predictions of said flux, said predictions being determined according to a stored magnetic field model, thereby, said processor estimating a new magnetic field model, wherein the number of the generators times the number of the sensors is larger than the number of degrees of freedom required to track an object in said volume of interest, which provides additional information relating to the deviations between the magnetic field predicted by said stored magnetic field model and said measurements of said flux of said magnetic field, wherein said processor employs said additional information when re-estimating said parameters characterizing said magnetic field model.

34. The system according to claim 33, further including an imager coupled firmly coupled with said free standing mapping handle and with said two freestanding magnetic field detectors, said imager acquiring at least one image of articles present within said volume of interest, said processor determines the poses of said imager and said two freestanding magnetic field detectors in a reference coordinates system according to said at least one image and the known pose of said articles in said reference coordinate system.

35. The system according to claim 34, wherein said processor registers said magnetic coordinate system and said reference coordinate system according the determined poses said two freestanding magnetic field detectors in said magnetic coordinate system and said reference coordinate system.

36. The system according to claim 34, wherein the spatial relationship between said two freestanding magnetic field detectors is known.

37. The system according to claim 33, wherein said processor is further coupled with said magnetic field transmitter.

38. The system according to claim 33 further including a memory coupled with said processor, said memory storing said stored magnetic field model, said memory further stores said new magnetic field model with said new magnetic field model instead of said stored magnetic field model, thereby said new magnetic field model becomes said stored magnetic field model.

39. The system according to claim 33, wherein said two freestanding magnetic field detectors are moved within said volume of interest at a random trajectory.

40. The system according to claim 33, wherein said two freestanding magnetic field detectors are moved within said volume of interest through a plurality of mapping regions.

41. The system according to claim 33, further including a guide, said guide guiding an operator to freely move said two freestanding magnetic field detectors within said volume of interest.

42. The system according to claim 41, wherein said guide guides said operator to freely move said two freestanding magnetic field detectors within said volume of interest at a random trajectory.

43. The system according to claim 41, wherein said guide guides said operator to freely move said two freestanding magnetic field detectors within said volume of interest through a plurality of mapping regions.

44. The system according to claim 43, wherein said guide is a display displaying representations of said mapping regions and said two freestanding magnetic field detectors, said representations being marked when said magnetic field detector passes there through.

45. The system according to claim 41, wherein said guide sounds audio signals corresponding to directions.

46. The system according to claim 33, wherein each said two freestanding magnetic field detectors includes three magnetic field sensors.

47. The system according to claim 33, wherein said magnetic field transmitter includes three magnetic field generators.

* * * * *